(12) United States Patent
Meron et al.

(10) Patent No.: US 6,299,153 B1
(45) Date of Patent: Oct. 9, 2001

(54) WAFER LATCH WITH A BALL BEARING ASSEMBLY

(75) Inventors: Ovadia Meron, Rego Park; Dmitriy Genkin, Brooklyn, both of NY (US)

(73) Assignee: Discreet Industries Corporation, Mineola, NY (US)

( * ) Notice: Subject to any disclaimer, the term of this patent is extended or adjusted under 35 U.S.C. 154(b) by 0 days.

(21) Appl. No.: 09/361,783

(22) Filed: Jul. 26, 1999

(51) Int. Cl.[7] .................................................. B23Q 3/00

(52) U.S. Cl. ..................... 269/903; 269/128; 269/135; 269/150; 451/365

(58) Field of Search ..................... 292/256, 23; 269/903, 269/128, 135, 150; 451/364, 365, 379

(56) References Cited

U.S. PATENT DOCUMENTS

| | | | | |
|---|---|---|---|---|
| 4,473,455 | * | 9/1984 | Dean et al. | 269/903 |
| 4,971,676 | * | 11/1990 | Doue et al. | 269/903 |
| 5,700,297 | * | 12/1997 | Vollaro | 269/903 |
| 5,785,307 | * | 7/1998 | Chung | 269/903 |
| 6,010,094 | * | 1/2000 | Csik et al. | 292/23 |

* cited by examiner

Primary Examiner—Derris H. Banks
Assistant Examiner—Lee Wilson
(74) Attorney, Agent, or Firm—Blakely Sokoloff Taylor & Zafman LLP

(57) ABSTRACT

A latch for securing a wafer to a clamp plate. The latch may include a bearing that couples a wheel to a horizontal shaft. The horizontal shaft is adapted to rotate relative to the clamp ring so that the wheel secures the wafer. The bearing minimizes the amount of particles generated by the moving components of the latch that may contaminant the wafer.

20 Claims, 2 Drawing Sheets

WAFER LATCH WITH A BALL BEARING ASSEMBLY

BACKGROUND OF THE INVENTION

1. Field of the Invention

The present invention relates to a latch for securing a semiconductor wafer to a clamp ring, weldment or clamp ring for use in a fabrication process.

2. Background Information

Integrated circuits are typically fabricated in a flat circular wafer that is cut from an ingot of semiconductor material. Various lithographic, sputtering, etc. processes are performed on the wafer to create the integrated circuits as is known in the art.

Each wafer is typically secured to a clamp weldment or tab ring of the fabrication equipment by a plurality of latches located about the ring. Each latch may have a roller wheel that is rolled onto the wafer to press the outer wafer edge into the ring. The roller wheel rotates about a horizontal shaft that extends from a latch body. The latch body can swivel about a post that is vertically mounted to the ring. The latch body can be rotated to move the roller wheel between a latched position and an unlatched position.

Because of high temperatures and the migration of material being sputtered onto the wafer it has been found that the roller wheel will drag and stick when the latch is moved to the latched position. This drag increases friction and may create particles that contaminate the wafer. It would be desirable to provide a wafer clamp that minimizes the amount of roller wheel drag and contaminants produced by the clamp.

SUMMARY OF THE INVENTION

An embodiment of the present invention may include a latch for securing a wafer to a substrate such as a clamp plate. The latch weldment or tab ring of a wafer holder may include a bearing that allows relative movement between a first element and a second element.

DETAILED DESCRIPTION

Figure 1:
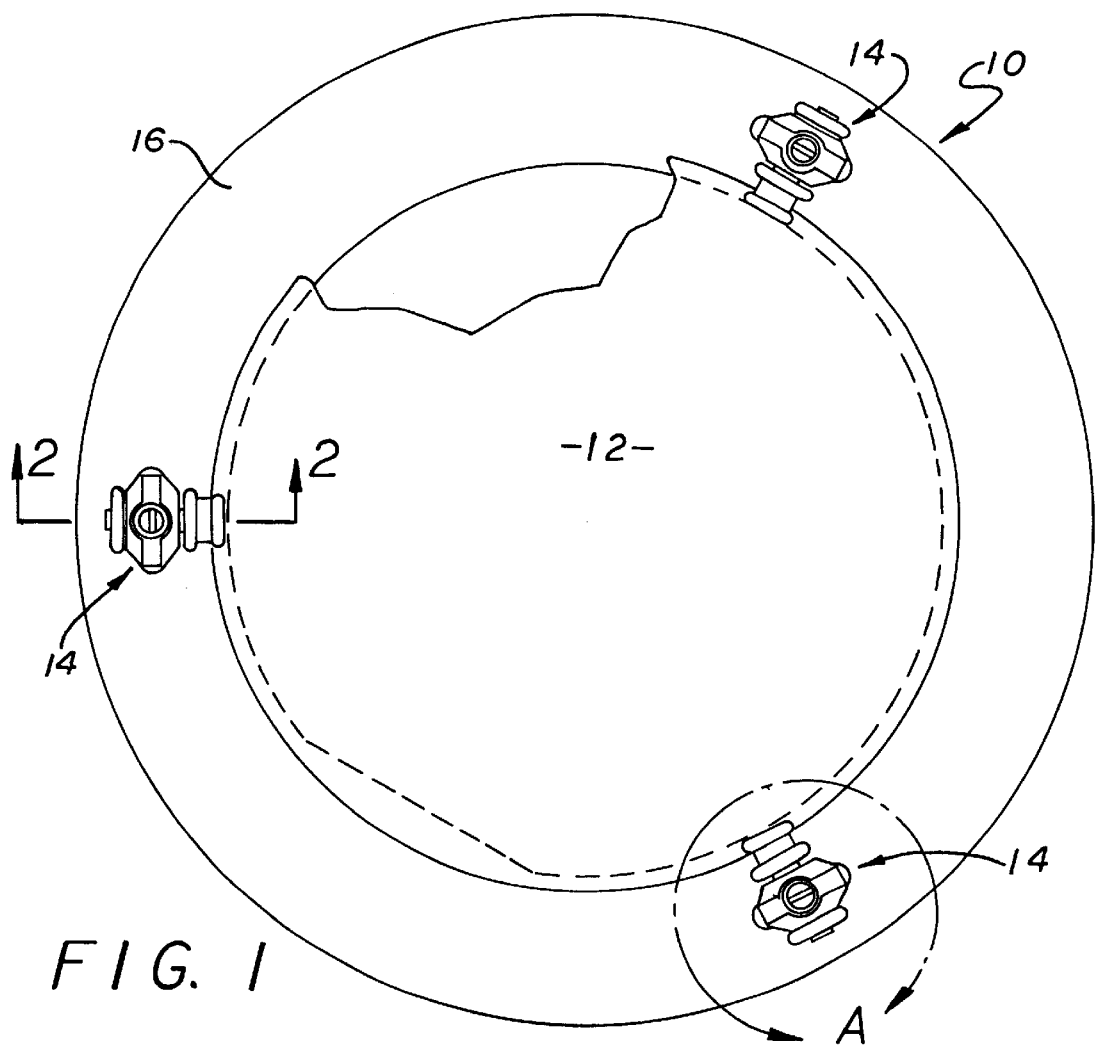
FIG. 1 is a perspective view of an embodiment of a clamp assembly of the present invention.

Referring to the drawings more particularly by reference numbers, FIG. 1 shows a wafer holder assembly 10 of the present invention. The wafer holder assembly 10 may be assembled into semiconductor fabrication equipment (not shown). The assembly 10 may secure a wafer 12 during one or more fabrication processes. By way of example, the fabrication process may include oxidation, gaseous deposition, ion implantation, metal deposition, sputtering, electron beam exposure and gaseous etching.

The wafer holder assembly 10 may include a plurality of latches 14 that are mounted to a clamp plate 16. Alternatively, the latches may be mounted to a weldment or tab ring (not shown). The latches 14 may be equally spaced about the plate 16 to secure the edges of the wafer 12. The clamp plate 16 may be assembled into the fabrication equipment.

Figure 2:
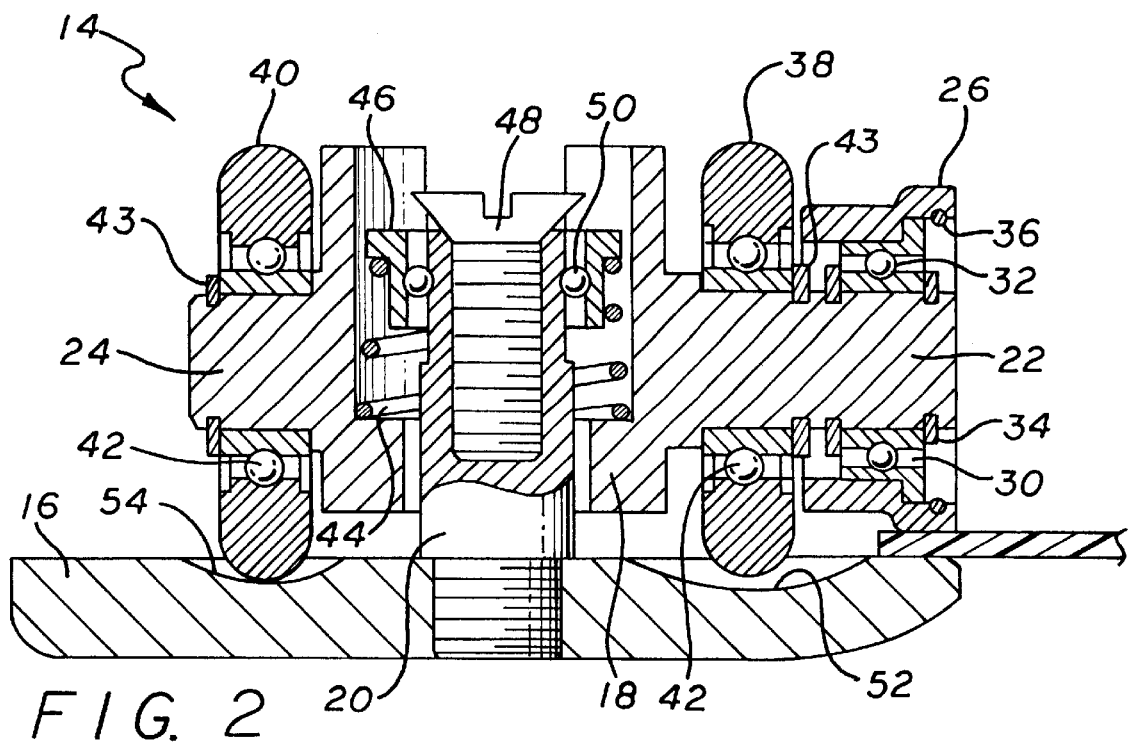
FIG. 2 is a cross-sectional view of a latch of the assembly.

FIG. 2 shows an embodiment of a latch 14. The latch 14 may include a body 18 that is pivotally connected to a post 20. The post 20 may be screwed into the clamp plate 16. The body 18 may include a first horizontal shaft 22 and a second horizontal shaft 24. The clamp 14 may include a wheel 26 that can rotate about the first horizontal shaft 22. The wheel 26 may be coupled to the horizontal shaft 22 by a wheel bearing 30. The wheel bearing 30 may include ball bearings 32 that allow relative movement between the wheel 26 and the shaft 22. The bearing 32 reduces the friction and amount of particles that can be generated when the wheel 26 rotates about the shaft 22.

The bearing 30 can be coupled to the shaft 22 by a pair of clips 34. The wheel 26 can be coupled to the shaft 22 by clip 36.

The latch 14 may include a first roller wheel 38 that is coupled to the first horizontal shaft 22 and a second roller wheel 40 coupled to the second horizontal shaft 24. The roller wheels 38 and 40 can roll along the clamp plate 16 when the body 18 is rotated about the post 20. Each roller wheel 38 and 40 may include ball bearings 42 to minimize the frictional contact between the wheels 38 and 40 and the shafts 22 and 24, respectively. The roller wheels 38 and 40 may be secured to the shafts 22 and 24 by clips 43.

The body 18 may be coupled to the post 20 by a spring 44, a collar 46 and a screw 48. The spring 48 allows vertical movement of the body 18 and the roller wheels 38 and 40. The collar 46 may have ball bearings 50 that allow the body 18 to rotate about the post 20.

The clamp plate 16 may have a first detent indentation 52 and a second detent indentation 54. The body 18 can be rotated so that the first roller wheel 38 is located within the first indentation 52, the second wheel 40 is within the second indentation 54 and the wheel 26 presses the wafer 12. The first indentation 52 may have a depth that is greater than the second indentation 54 so that the first wheel 38 does not interfere with the wheel 26 pressing onto the wafer 12.

Figure 3:
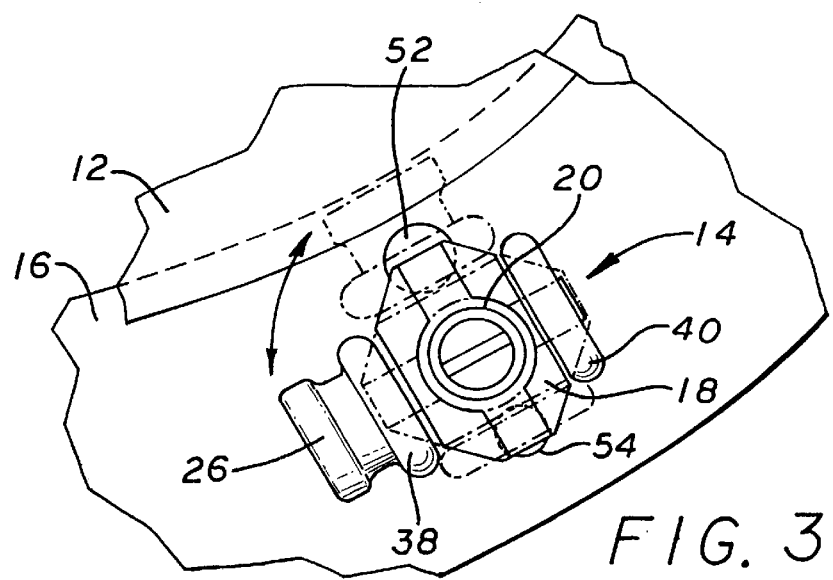
FIG. 3 is an enlarged top view showing a latch rotated relative to a clamp plate.

Referring to FIG. 3, in operation, each latch 14 is rotated so that the wheels 38 and 40 are not within the indentations 52 and 54. This allows the wafer 12 to be placed onto the clamp plate 16. The body 18 is then rotated about the post 20 until the roller wheels 38 and 40 roll into the indentations 52 and 54, respectively. Rotation of the body 18 also rolls the wheel 26 onto the wafer 12 to secure the same.

Figure 4:
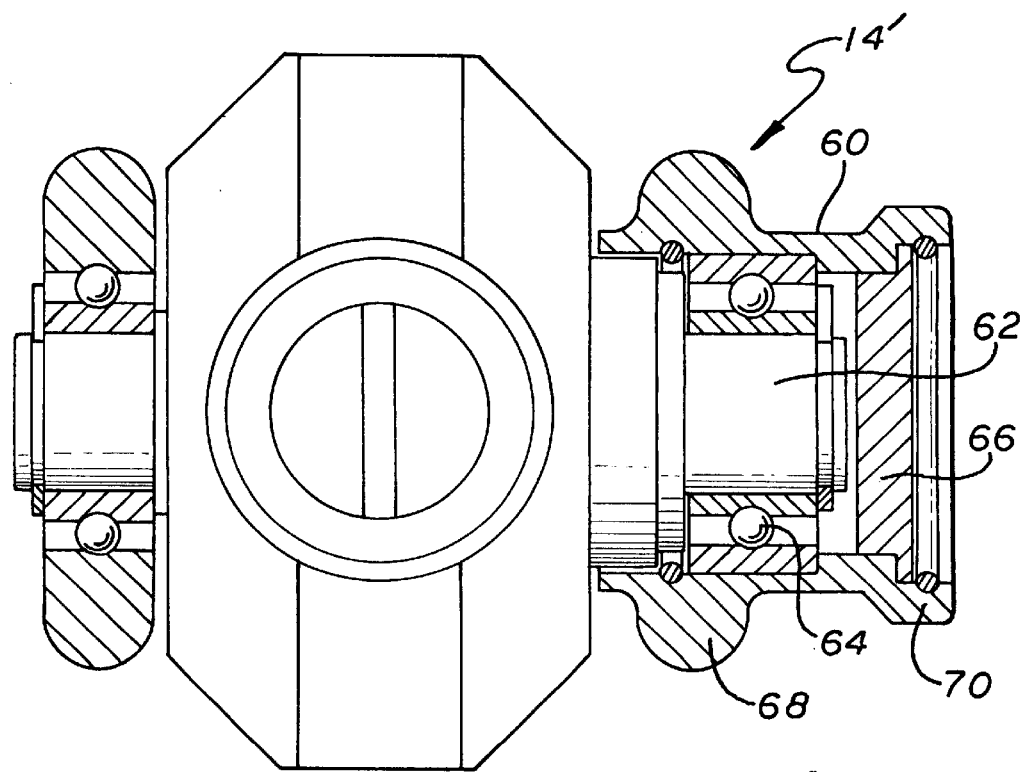
FIG. 4 is a cross-sectional view of an alternate embodiment of a latch.

FIG. 4 shows an alternate embodiment of a clamp 14' wherein the clamp wheel and first roller wheel are integrated into one wheel 60. The wheel 60 is coupled to a first horizontal shaft 62 by a bearing assembly 64. The bearing assembly 64 may be sealed by a cap 66. The roller bearing wheel 60 may have a roller portion 68 that can roll along the clamp plate 16 and a clamp portion 70 that can roll onto the wafer 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A latch for securing a wafer, comprising:
   a first element;
   a second element that can move relative to said first element; and
   a bearing that is coupled to said first element and said second element, said bearing includes a ball bearing.

2. The latch of claim 1, wherein said first element is a post and said second element is a body.

3. The latch of claim 2, further comprising a collar and a spring that couple said body to said post.

4. The latch of claim 1, wherein said first element is a post.

5. The latch of claim 4, wherein said second element is a spring.

6. The latch of claim 4, wherein said second element is a collar.

7. The latch of claim 1 being attached to a clamp plate for assembly as a wafer holder assembly.

8. A latch for securing a wafer, comprising:
   a first element being a shaft;
   a second element that can move relative to said first element, said second element is a wheel; and,
   a bearing that is coupled to said first element and said second element.

9. The latch of claim 8, further comprising a roller wheel that can rotate about said shaft.

10. The latch of claim 8, wherein said shaft is oriented in a generally horizontal arrangement.

11. The latch of claim 8 being attached to a clamp plate for assembly as a wafer holder assembly.

12. A wafer holder assembly for securing a wafer, comprising:
    a clamp plate adapted to support the wafer;
    a post that extends from said clamp plate;
    a first horizontal shaft adapted to rotate about said post;
    a latch wheel that can rotate about said first horizontal shaft and is adapted to clamp the wafer onto said clamp plate; and,
    a wheel bearing that couples said latch wheel to said first horizontal shaft.

13. The wafer holder assembly of claim 12, wherein said wheel bearing includes a ball bearing.

14. The wafer holder assembly of claim 12, further comprising a first roller wheel that is coupled to said first horizontal shaft.

15. The wafer holder assembly of claim 14, further comprising a second horizontal shaft adapted to rotate about said post and a second roller wheel coupled to said second horizontal shaft.

16. The wafer holder assembly of claim 15, wherein said first and second horizontal shafts extend from a body.

17. The wafer holder assembly of claim 16, further comprising a collar and a spring that couple said body to said post, said collar including a bearing.

18. The wafer holder assembly of claim 15, wherein said first roller wheel can roll into a first detent indentation of said clamp plate.

19. The wafer holder assembly of claim 18, wherein said second roller wheel can roll into a second detent indentation of said clamp plate.

20. The wafer holder assembly of claim 19, wherein said first detent indentation has a depth greater than said second detent indentation.

* * * * *